United States Patent
Tsai et al.

(10) Patent No.: US 9,085,456 B2
(45) Date of Patent: Jul. 21, 2015

(54) SUPPORT STRUCTURE FOR TSV IN MEMS STRUCTURE

(75) Inventors: Yi Heng Tsai, Hsin-Chu (TW); Kuei-Sung Chang, Kaohsiung (TW); Hung-Chia Tsai, Taichung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 483 days.

(21) Appl. No.: 13/471,229

(22) Filed: May 14, 2012

(65) Prior Publication Data
US 2013/0181355 A1 Jul. 18, 2013

Related U.S. Application Data

(60) Provisional application No. 61/587,009, filed on Jan. 16, 2012.

(51) Int. Cl.
| H01L 29/82 | (2006.01) |
| H01L 29/84 | (2006.01) |
| H01L 23/10 | (2006.01) |
| B81C 1/00  | (2006.01) |

(52) U.S. Cl.
CPC ......... B81C 1/00238 (2013.01); B81C 1/0023 (2013.01); *B81C 2203/0792* (2013.01)

(58) Field of Classification Search
CPC ............ B81C 1/00238; B81C 1/0023; B81C 2203/0792

USPC ............... 257/415, 414, E23.193; 438/50, 51
See application file for complete search history.

(56) References Cited

U.S. PATENT DOCUMENTS

| 6,938,485 B2 | 9/2005 | Kuisma et al. |
| 7,142,349 B2 | 11/2006 | Yang |
| 7,275,424 B2 * | 10/2007 | Felton et al. ................. 73/104 |
| 7,382,513 B2 | 6/2008 | Yang |
| 7,696,004 B2 * | 4/2010 | Yuan et al. ................. 438/106 |
| 8,186,221 B2 | 5/2012 | Lin et al. |
| 8,466,606 B2 * | 6/2013 | Chen et al. ................. 310/348 |
| 2010/0058865 A1 | 3/2010 | Zhang et al. |
| 2011/0154905 A1 | 6/2011 | Hsu et al. |
| 2011/0157010 A1 | 6/2011 | Kothari et al. |
| 2011/0221455 A1 * | 9/2011 | Feyh ........................... 324/661 |
| 2013/0015743 A1 | 1/2013 | Tsai et al. |

* cited by examiner

*Primary Examiner* — Luan C Thai
(74) *Attorney, Agent, or Firm* — Slater & Matsil, L.L.P.

(57) ABSTRACT

An embodiment is a method for forming a microelectromechanical system (MEMS) device. The method comprises forming a MEMS structure over a first substrate, wherein the MEMS structures comprises a movable element; forming a bonding structure over the first substrate; and forming a support structure over the first substrate, wherein the support structure protrudes from the bonding structure. The method further comprises bonding the MEMS structure to a second substrate; and forming a through substrate via (TSV) on a backside of the second substrate, wherein the overlying TSV is aligned with the bonding structure and the support structure.

20 Claims, 17 Drawing Sheets

SUPPORT STRUCTURE FOR TSV IN MEMS STRUCTURE

This application claims the benefit of U.S. Provisional Application No. 61/587,009, filed on Jan. 16, 2012, entitled "Support Structure for TSV in MEMS Structure," which application is hereby incorporated herein by reference.

BACKGROUND

Microelectromechanical systems (MEMS) are the technology of forming micro-structures with dimensions in the micrometer scale (one millionth of a meter). Significant parts of the technology have been adopted from integrated circuit (IC) technology. Most of the devices are built on silicon wafers and realized in thin films of materials. There are three basic building blocks in MEMS technology, which are the ability to deposit thin films of material on a substrate, to apply a patterned mask on top of the films by photolithographic imaging, and to etch the films selectively to the mask. A MEMS process is usually a structured sequence of these operations to form actual devices.

MEMS applications include inertial sensors applications, such as motion sensors, accelerometers, and gyroscopes. Other MEMS applications include optical applications such as movable mirrors, and RF applications such as RF switches and resonators.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION OF ILLUSTRATIVE EMBODIMENTS

Figure 1A:
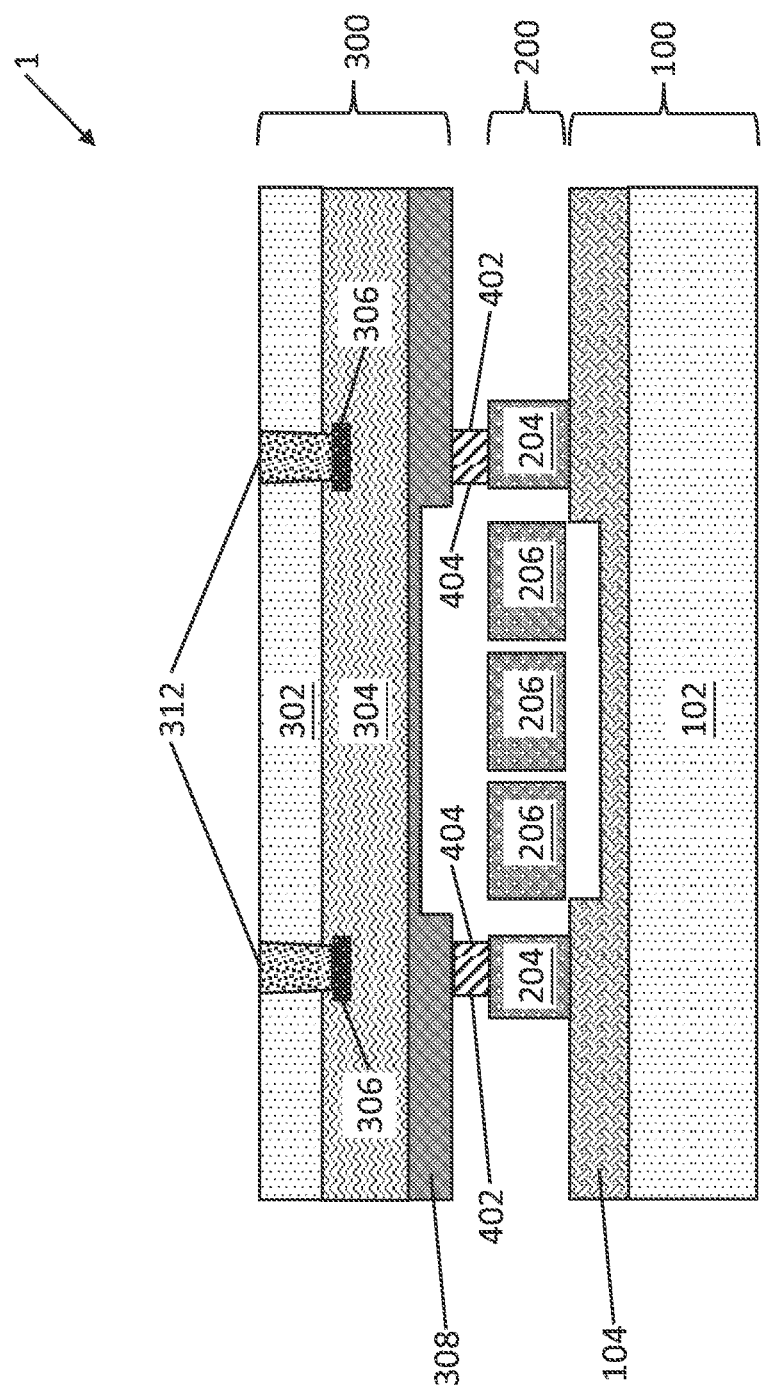
FIG. 1a illustrates in cross section an illustrative embodiment of a MEMS device.

Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

Embodiments will be described with respect to a specific context, namely a supporting structure for through silicon vias (TSVs) in a MEMS device. Other embodiments may also be applied, however, to other encapsulation devices which include TSVs.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

With reference now to FIG. 1a, there is shown a cross-sectional view of a MEMS device 1. The MEMS device 1 includes a wafer 100, a MEMS wafer 200, and a cap wafer 300. The wafer 100 includes a dielectric layer 104 on a substrate 102. In this embodiment, the substrate 102 may be a semiconductor substrate such as silicon and, in other embodiments, includes silicon germanium (SiGe), silicon carbide, a ceramic substrate, a quartz substrate, the like, or a combination thereof. Other substrates that may be used include multi-layered substrates, gradient substrates, or hybrid orientation substrates. A recess 106 (see FIG. 2b) may be formed in the dielectric layer 104.

The wafer 100 may include active and passive devices (not shown in FIG. 1a). As one of ordinary skill in the art will recognize, a wide variety of active and passive devices such as transistors, capacitors, resistors, combinations of these, and the like may be used to generate the structural and functional requirements of the design for the MEMS device 1. The active and passive devices may be formed using any suitable methods.

MEMS wafer 200 includes movable elements 206 and static elements 204. The MEMS wafer 200 may comprise similar materials as the substrate 102, although substrate 102 and MEMS wafer 200 need not both be the same material. The MEMS wafer 200 is bonded to the wafer 100. In an embodiment, the bonding process may be fusion bonding. In other embodiments the bonding process may include thermo-compression bonding, direct bonding, glue bonding, eutectic bonding, or the like. The MEMS wafer 200 is patterned and etched to form movable elements 206 over the recess 106 and static elements 204 on the top surface of the dielectric layer 104.

The cap wafer 300 includes an interconnect structure 304 on a substrate 302, a dielectric layer 308 on the interconnect structure 304, metal features 306 on a top surface of the substrate 302, and through substrate vias ("TSVs") 312 (also known as a "through semiconductor via" or a "through silicon via"). In this embodiment, the substrate 302 may be silicon and, in other embodiments, includes silicon germanium (SiGe), silicon carbide, any semiconductor substrate, a ceramic substrate, a quartz substrate, the like, or a combination thereof. Other substrates that may be used include multi-layered substrates, gradient substrates, or hybrid orientation substrates.

The cap wafer 300 may include active and passive devices (not shown in FIG. 1a). As one of ordinary skill in the art will recognize, a wide variety of active and passive devices such as transistors, capacitors, resistors, combinations of these, and the like may be used to generate the structural and functional requirements of the design for the MEMS device 1. The active and passive devices may be formed using any suitable methods.

The interconnect structure 304 may be formed on the top surface of the substrate 302. The interconnect structure 304 may provide electrical and physical connections between and/or to the active and passive devices, the movable elements 206, the static elements 204, and external devices through the metal features 306 and TSVs 312.

Figure 3A:
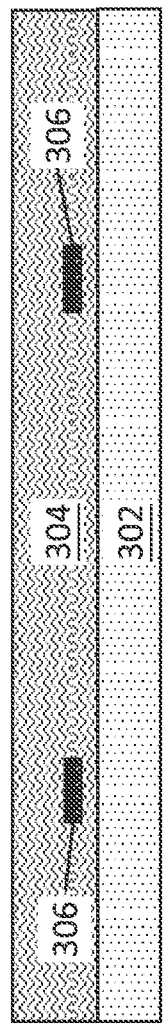
FIGS. 3a through 3c illustrate in cross section the steps in the processing of an illustrative cap wafer according to an embodiment.
Figure 3B:
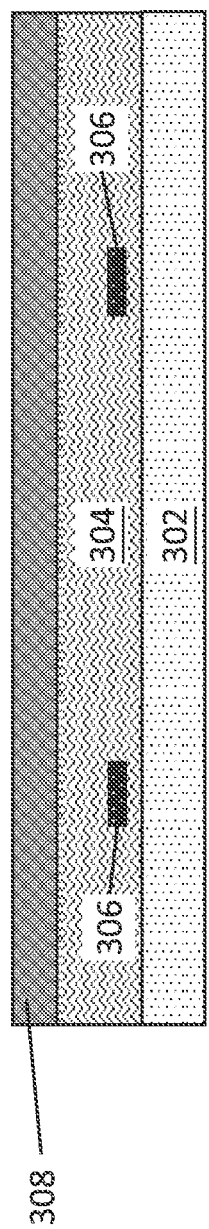
Figure 3C:
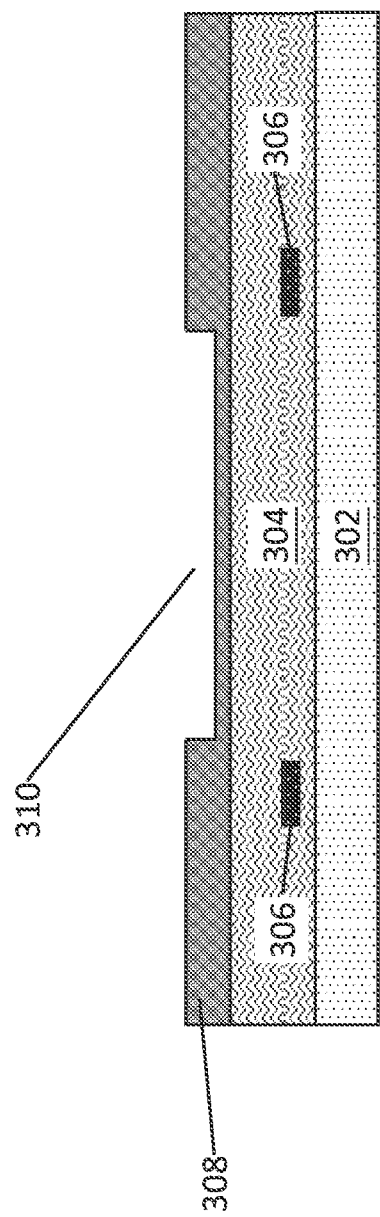

The dielectric layer 308 is formed on top of the interconnect structure 304 and a recess 310 is formed in the dielectric layer 308 (see FIG. 3c). The dielectric layer 308 may include metal vias to provide electrical and physical connections between the interconnect structure 304 and the movable elements 206 and the static elements 204 of the MEMS structure.

The cap wafer 300 is then bonded to the MEMS structure formed of the wafer 100 and MEMS wafer 200. In an embodiment, the bonding structure 402 may comprise a single material such as a polymer, an adhesive, a glass solder, or the like for an adhesive bonding process, a glass frit bonding process, or the like. In other embodiments, the bonding structure 402 may comprise two separate materials, one formed on cap wafer 300 and one formed on MEMS wafer 200. In this embodiment, the materials for the bonding structure 402 may comprise conductive materials such as Al, AlCu, Cu, Ge, AlGe, or the like and may be bonded together in a eutectic bonding process, a thermocompression bonding process, or the like.

The TSVs 312 are formed through a backside of the substrate 302 and are in electrical and physical contact with the metal features 306 on the top surface of the substrate 302. The bonding structure 402 includes support structure 404 (see FIG. 1c) to surround and provide structural support for the TSV 312. The TSVs 312 may be formed by etching recesses into the backside of the substrate 302 followed by deposition of a barrier layer and a conductive material in the recesses.

Figure 1B:
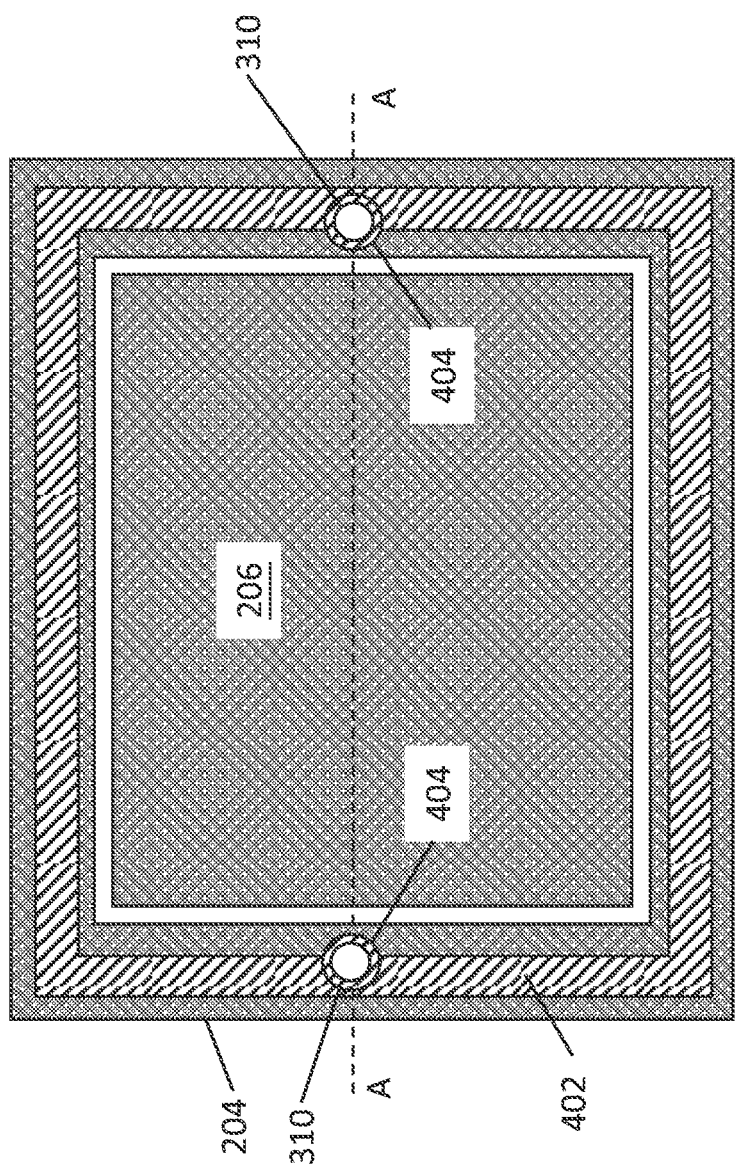
FIGS. 1b through 1d illustrate in top down view an illustrative embodiment of a MEMS device.
Figure 1C:
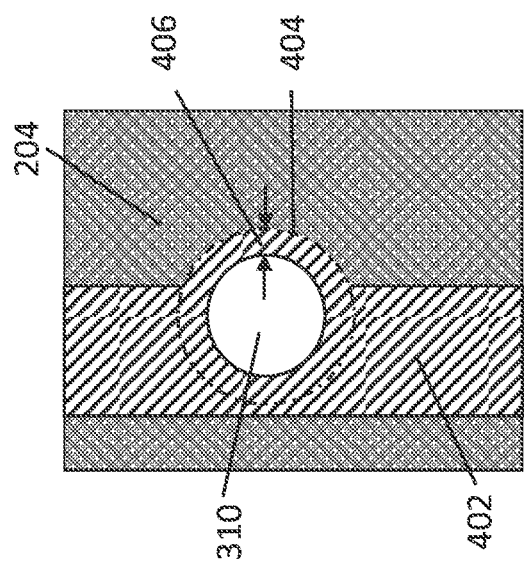

FIG. 1b illustrates a top down view of the MEMS device 1 and FIG. 1c illustrates a magnified view of the top down view including a TSV 312, the bonding structure 402, and the support structure 404. The inside edge of the bonding structure 402 may be further outside than the inside edge of the TSV 312 to maximize the MEMS area in the cavity surrounding the movable elements 206. As shown in FIGS. 1b and 1c, the support structure 404 protrudes from the inside edge of the bonding structure 402. The protruding support structure 404 surrounds the projection of the overlying TSV 312 by a width 406 from 1 μm to 20 μm (see FIG. 1c). The protruding support structure 404 may conformally surround the projection of the overlying TSV 312 to provide support with minimal increase to the bonding structure 402. In this embodiment, the TSV 312 and the inside edge of the bonding structure 402 may be substantially circular in shape, although other embodiments contemplate other shapes such as, for example, a square, a rectangle, or an octagon.

Figure 1D:
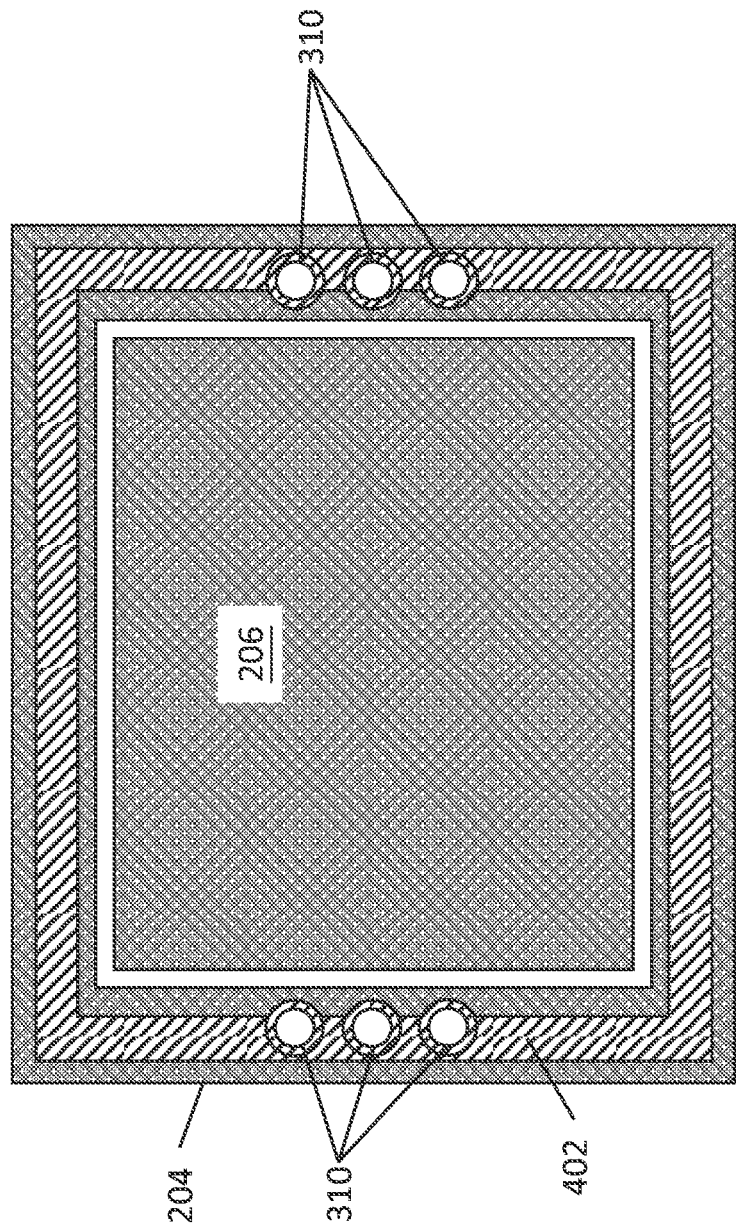

FIG. 1d illustrates another embodiment of the MEMS device 1 where there are six TSVs 312 rather than two as previously shown. The TSVs 312 may be formed in a similar process as previously described. Although the TSVs are shown, in FIGS. 1b and 1d, to be only on the left and right sides of the MEMS device 1, they may also be on the top and bottom sides of the MEMS device. These TSVs 312 may also include the protruding support structure 404 to fully surround and support the projection of the overlying TSVs 312. As one of ordinary skill in the art will appreciate, the TSVs 312 may vary in size relative to each other. The support structure 404 may increase accordingly to fully surround and support the TSVs 312 as projected onto the bonding structure 402.

FIGS. 2a through 4b illustrate a process to form a MEMS device 1 according to an embodiment. Although this embodiment is discussed with steps performed in a particular order, steps may be performed in any logical order.

Figure 2A:
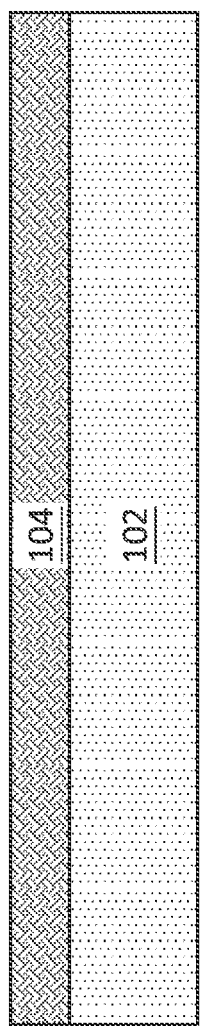
FIGS. 2a through 2d illustrate in cross section the steps in the processing of an illustrative MEMS device wafer according to an embodiment.

With reference now to FIGS. 2a through 2d, steps in the processing of an illustrative wafer 100 and MEMS wafer 200 are shown. FIG. 2a illustrates a cross-sectional view of a dielectric layer 104 on a substrate 102 at an intermediate stage of processing. The substrate 102 may be silicon, SiGe, silicon carbide, any semiconductor substrate, a ceramic substrate, a quartz substrate, the like, or a combination thereof. The substrate 102 may comprise bulk silicon, doped or undoped, or an active layer of a silicon-on-insulator (SOI) substrate. Other substrates that may be used include multi-layered substrates, gradient substrates, or hybrid orientation substrates.

Figure 2B:
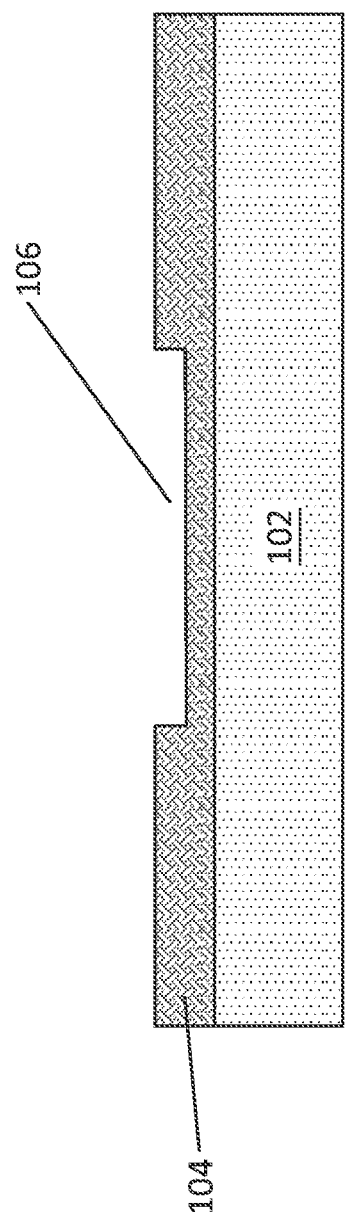

The dielectric layer 104 may be formed on the substrate 102. The dielectric layer 104 may be made of one or more suitable dielectric materials such as silicon oxide, silicon nitride, low-k dielectrics such as carbon doped oxides, extremely low-k dielectrics such as porous carbon doped silicon dioxide, a polymer such as polyimide, the like, or combinations thereof. The dielectric layer 104 may be deposited through a process such as chemical vapor deposition (CVD), or the like, although any acceptable process may be utilized. In FIG. 2b, the recess 106 is formed in the dielectric layer 104. The recess 106 may be formed by, for example, etching, milling, laser techniques, combinations of these, or the like.

Figure 2C:
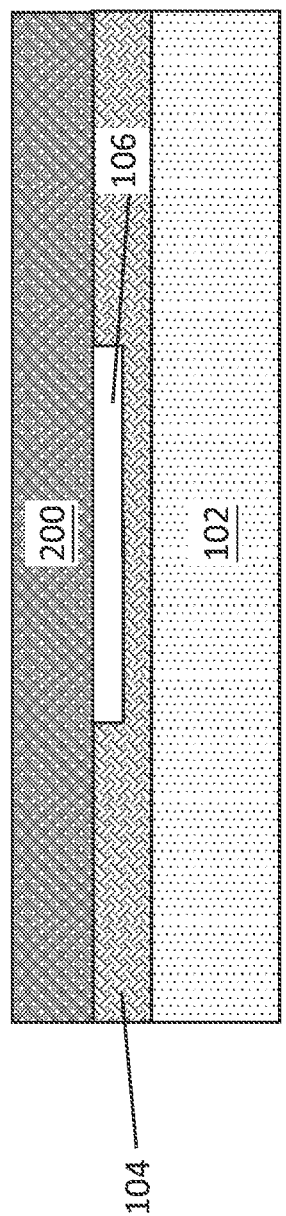

FIG. 2c illustrates the bonding of the MEMS wafer 200 to the top surface of the dielectric layer 104 and over the recess 106. The MEMS wafer 200 may comprise similar materials as the substrate 102, such silicon, SiGe, silicon carbide, any semiconductor substrate, a ceramic substrate, a quartz substrate, the like, or a combination thereof, although substrate 102 and MEMS wafer 200 need not both be the same material. The MEMS wafer 200 and the dielectric layer 104 may be bonded by direct bonding, fusion bonding, thermocompression bonding, glue bonding, eutectic bonding, or the like. The bonding process may be improved or expedited by the application of heat or pressure and has an overlay tolerance of up to about 4 μm. The MEMS wafer 200 may be doped through an implantation process to introduce p-type or n-type impurities into the MEMS wafer 200.

Figure 2D:
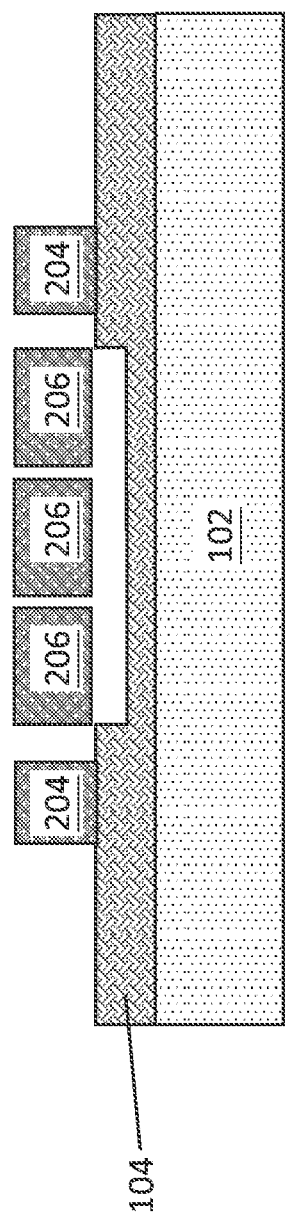

FIG. 2d illustrates the patterning of the MEMS wafer 200 into movable elements 206 and static elements 204. The patterning process may be accomplished by depositing a commonly used mask material (not shown) such as photoresist or silicon oxide over the MEMS wafer 200. The mask material is then patterned and the MEMS wafer 200 is etched in accordance with the pattern. The resulting structure is a MEMS device 1 having movable elements 206 formed over recess 106 to allow for free movement in at least one axis. The movable elements 206 may be supported by hinges, springs, beams, or the like (not shown) which may extend from the static elements 204. In an alternative embodiment, the movable elements 206, static elements 204, and recess 106 may be formed by first forming recess 106 and filling the recess with a sacrificial oxide (not shown). In this embodiment, the MEMS wafer 200 may then be bonded to the dielectric layer 104 and patterned as discussed above. The sacrificial oxide (not shown) may then be released by a wet etch process, such as a diluted hydrofluoric acid (DHF) treatment or a vapor hydrofluoric acid (VHF) treatment, to form the movable elements 206 over the recess 106.

In another embodiment, the MEMS structure may be formed by depositing a semiconductor layer, e.g. a layer of silicon, on a top surface of the dielectric layer 104 and a sacrificial oxide (not shown) deposited in the recess 106. The silicon layer may then be patterned into the movable elements 206 and the static elements 204 by lithography techniques discussed above or other acceptable methods. The movable elements 206 are not movable at this point, as they are still on top of the dielectric layer 104. The sacrificial oxide (not shown) may then be released by a wet etch process, such as a DHF treatment or a VHF treatment, to form the movable elements 206 over the recess 106.

FIGS. 3a through 3c illustrate the processing of a cap wafer 300 according to an embodiment. In FIG. 3a, a cap wafer 300 is at an intermediate stage of processing. The cap wafer 300 may comprise an interconnect structure 304 on a substrate 302 and metal features 306 on the top surface of the substrate 302. The substrate 302 may comprise similar materials as the substrate 102 and MEMS wafer 200, such silicon, SiGe, silicon carbide, any semiconductor substrate, a ceramic substrate, a quartz substrate, the like, or a combination thereof, but need not be the same material as the substrate 102 or the MEMS wafer 200.

The substrate 302 may include active and passive devices (not shown in FIG. 3a). As one of ordinary skill in the art will recognize, a wide variety of active and passive devices such as transistors, capacitors, resistors, combinations of these, and the like may be used to generate the structural and functional requirements of the design for the MEMS device 1. The active and passive devices may be formed using any suitable methods.

The metal features 306 may be formed on a top surface of substrate 302 and in electrical contact with the interconnect structure 304 in order to provide external connections to the active and passive devices, the movable elements 206, and the static elements 204. The metal features 306 may comprise copper, nickel, aluminum, copper aluminum, tungsten, titanium, titanium nitride, gold, silver, combinations of these, such as alloys, or the like. The metal features 306 may be formed using a deposition process, such as sputtering, to form a layer of material (not shown) and portions of the layer of material may then be removed through a suitable process (such as photolithographic masking and etching) to form the metal features 306. However, any other suitable process may be utilized to form the metal features 306.

The interconnect structure 304 may be formed on the top surface of the substrate 302. The interconnect structure 304 may provide electrical and physical connections between and/or to the active and passive devices, the movable elements 206, the static elements 204, metal features 306, and external devices through the TSVs 312 (see FIG. 4b). The interconnect structure 304 may comprise any number or combination of metallization layers, inter-metal dielectric (IMD) layers, vias, and passivation layers. Vias are formed between metallization layers in the IMD layers. The metallization layers are formed by depositing an IMD layer, etching the metallization pattern of the layer in the IMD layer using, for example, acceptable photolithography techniques, depositing a conductive material for the metallization in the IMD, and removing any excess conductive material by, for example, chemical mechanical polishing (CMP). The photolithography technique may include a single damascene process or a dual damascene process, particularly when vias are formed through an IMD to an underlying metallization layer.

The IMD layers can be an oxide dielectric, such as a silicon dioxide ($SiO_2$), borophosphosilicate glass (BPSG), or other dielectric materials. The conductive material of the metallization layers may be, for example, copper, nickel, aluminum, copper aluminum, tungsten, titanium, gold, silver, combinations of these, such as alloys, or the like. The metallization layers may include barrier layers between the conductive material and the IMD material, and other dielectric layers, such as etch stop layers made of, for example, silicon nitride, may be formed between the IMD layers.

In FIG. 3b, a dielectric layer 308 is formed on the interconnect structure 304. The dielectric layer 308 may be made of one or more suitable dielectric materials such as silicon oxide, silicon nitride, low-k dielectrics such as carbon doped oxides, extremely low-k dielectrics such as porous carbon doped silicon dioxide, a polymer such as polyimide, combinations of these, or the like. The dielectric layer 308 may be deposited through a process such as CVD, atomic layer deposition (ALD), thermal treatments, or the like, although any acceptable process may be utilized. The dielectric layer 308 may include metal vias to provide electrical and physical connections between the interconnect structure 304 and the movable elements 206 and the static elements 204 of the MEMS structure. FIG. 3c illustrates the formation of a recess 310 in the dielectric layer 308. The recess 310 may be formed by, for example, etching, milling, laser techniques, combinations of these, or the like.

Figure 4A:
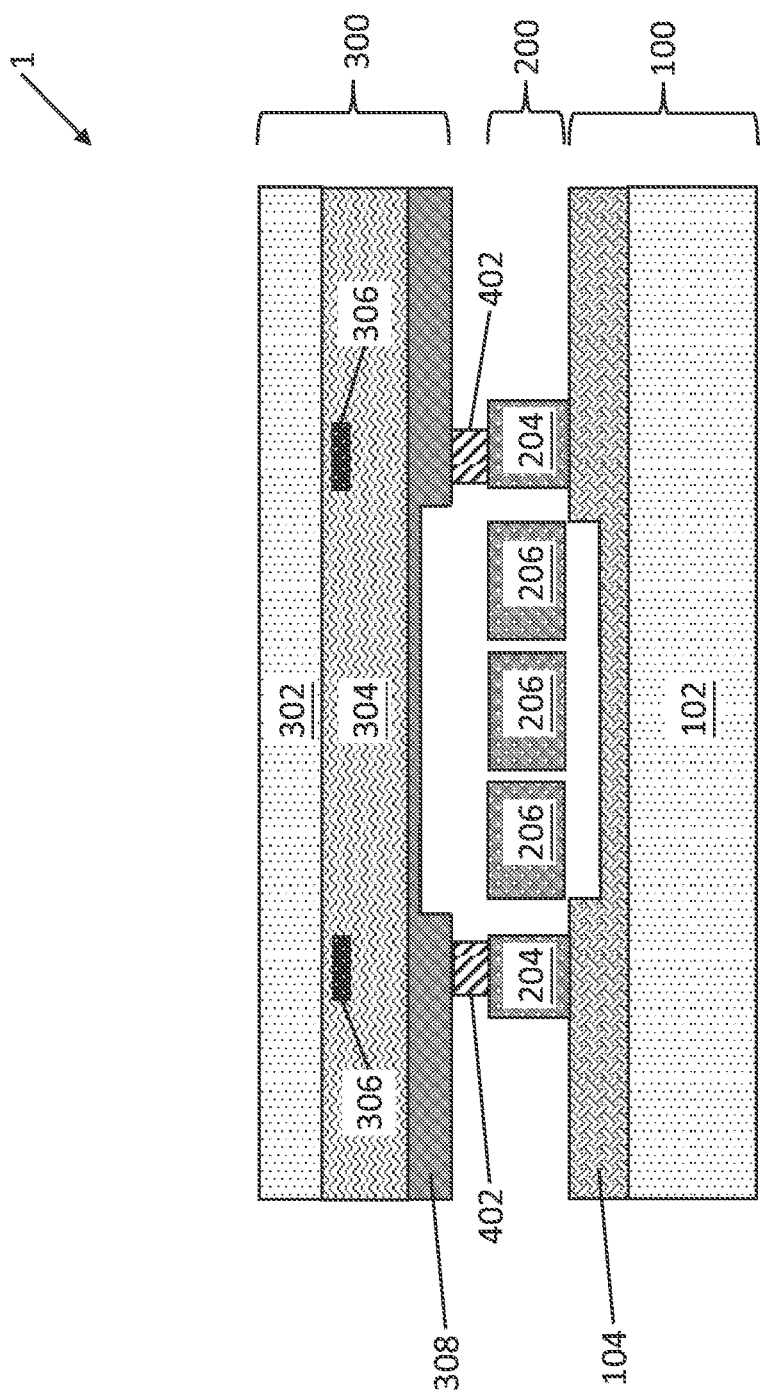
FIGS. 4a through 4b illustrate in cross section the steps in bonding a MEMS device wafer and a cap wafer according to an embodiment.
Figure 4B:
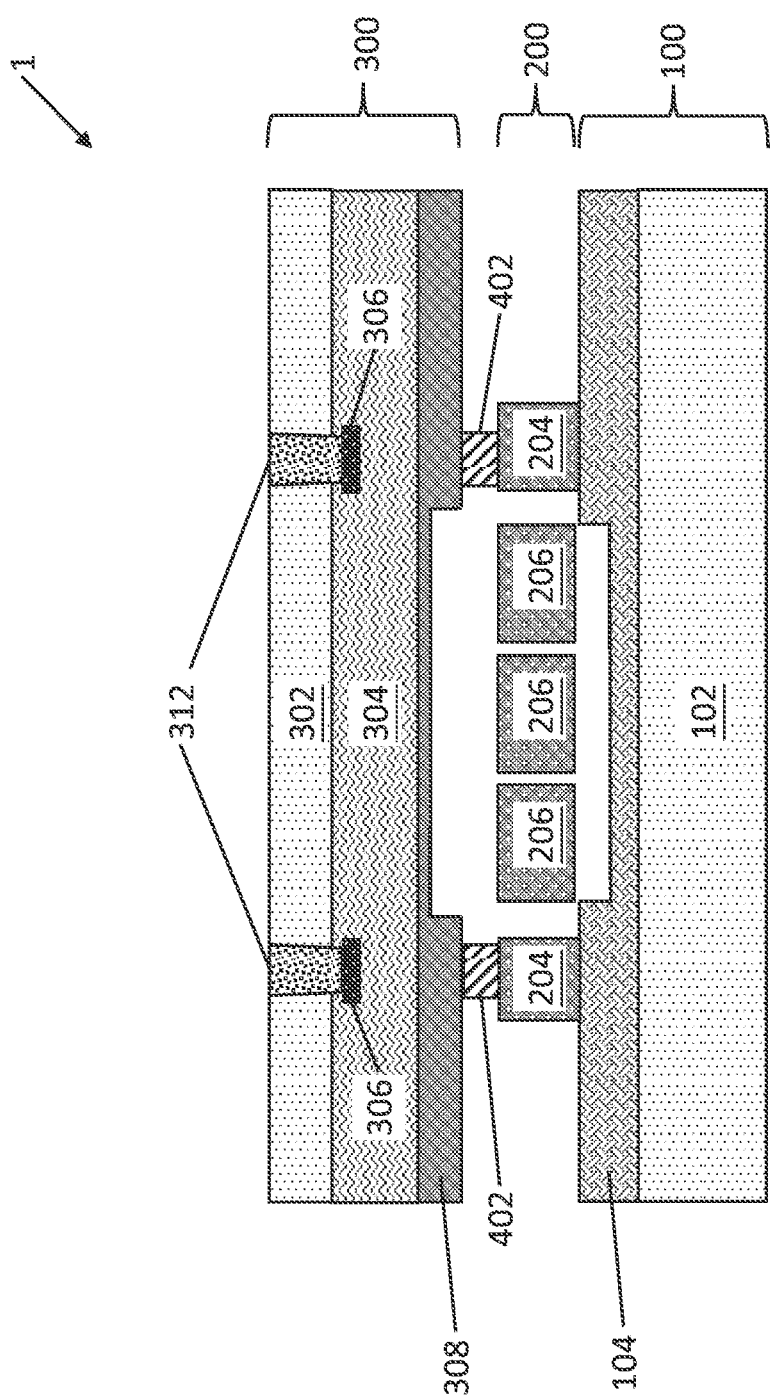

FIGS. 4a through 4b provide an illustrative process for bonding the structure comprising the wafer 100 and the MEMS wafer 200 to the cap wafer 300. The bonding structure 402 may be formed between the static elements 204 and the dielectric layer 308. In an embodiment, the bonding structure 402 may comprise a single material such as a polymer, an adhesive, a glass solder, or the like for an adhesive bonding process, a glass frit bonding process, or the like. In other embodiments, the bonding structure 402 may comprise two separate materials, one formed on the cap wafer 300 and one formed on the MEMS wafer 200. In this embodiment, the materials for the bonding structure 402 may comprise conductive materials such as Al, AlCu, Cu, Ge, AlGe, or the like and may be bonded together in a eutectic bonding process, a thermocompression bonding process, or the like. As shown in FIG. 1c, the bonding structure 402 includes support structure 404 to surround and provide structural support for the projection of the overlying TSV 312.

The backsides of the cap wafer 300 and wafer 100 may be thinned after the bonding process. The thinning process may include grinding and CMP processes, etch back processes, or other acceptable processes. Cap wafer 300 may be thinned to reduce the amount of processing time for the subsequent TSV formation process. Further, wafer 100 and cap wafer 300 may be thinned to reduce the overall package size of the MEMS device 1.

FIG. 4b illustrates the formation of TSVs 312 in the cap wafer 300. The TSVs 312 extend from a backside surface of substrate 302 to the metal features 306 which are on the top surface of substrate 302. The metal features 306 may be coupled, directly or indirectly, to metal interconnects in the interconnect structure 304. The TSVs 312 may be formed by forming recesses in the substrate 302 by, for example, etching, milling, laser techniques, combinations of these, or the like. A thin barrier layer (not shown) may be conformally deposited over the back side of the substrate 302 and in the recesses, such as by CVD, ALD, or the like. The barrier layer may comprise a nitride or an oxynitride, such as titanium nitride, titanium oxynitride, tantalum nitride, tantalum oxynitride, tungsten nitride, silicon dioxide, combinations of these, or the like. A conductive material may be deposited over the thin barrier layer and in the recesses. The conductive material may be formed by an electro-chemical plating process, CVD, ALD, physical vapor deposition (PVD), a combination of these, or the like. Examples of conductive materials are copper, tungsten, aluminum, silver, gold, germanium, combinations of these, such as alloys, or the like. The conductive material may be patterned to form the TSVs 312 conductive material.

Figure 5A:
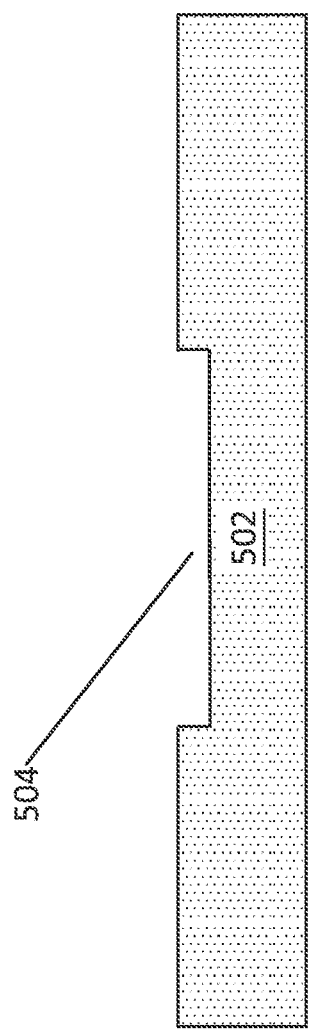
FIGS. 5a through 5c illustrate in cross section the steps in the processing of an illustrative MEMS device wafer according to another embodiment.
Figure 5B:
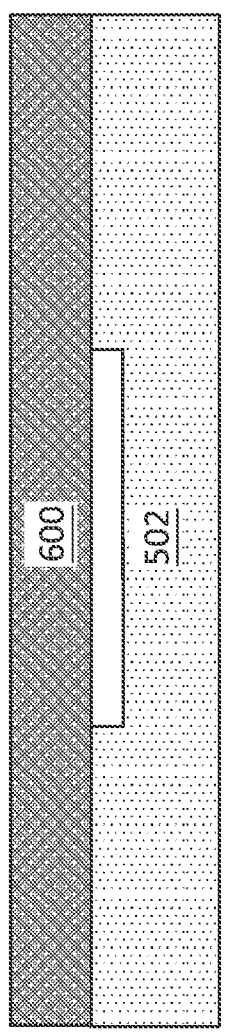
Figure 5C:
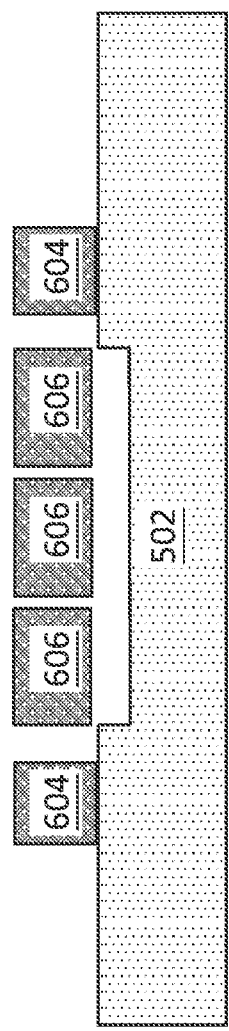
Figure 6:
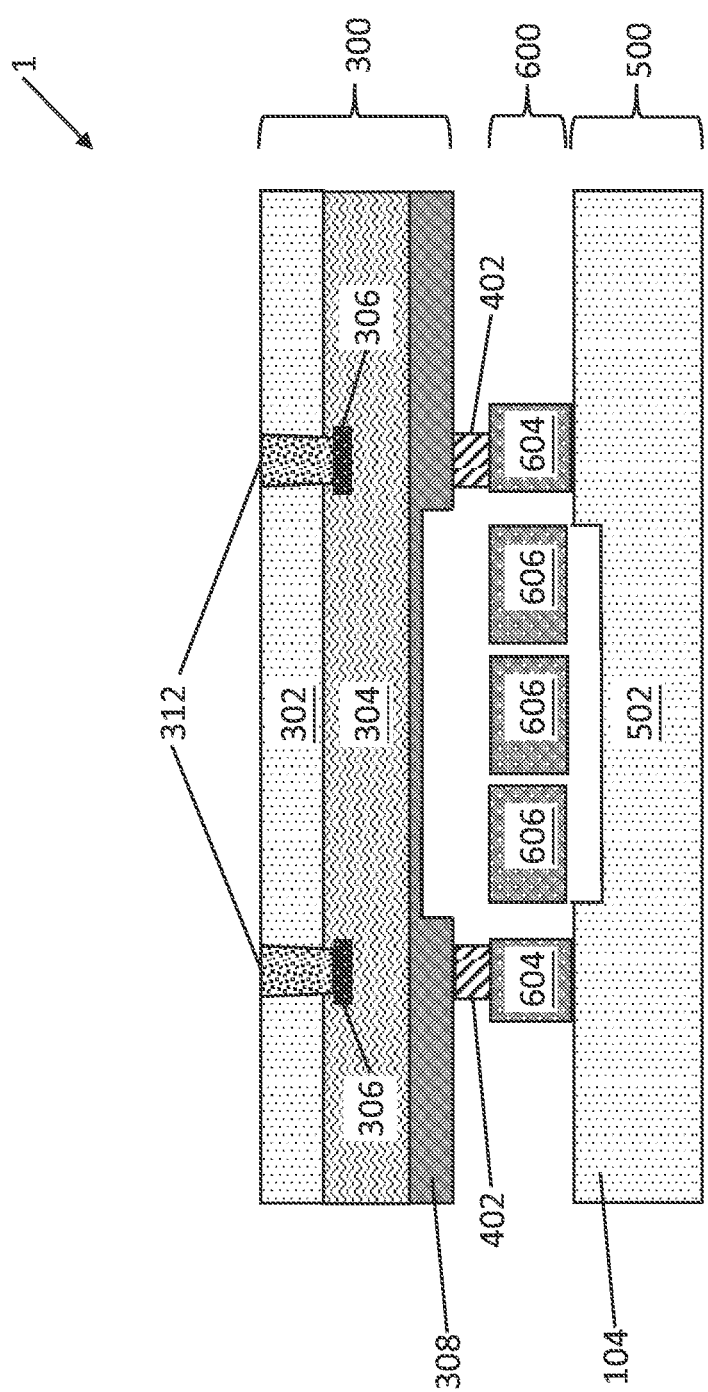
FIG. 6 illustrates bonding a MEMS device wafer and a cap wafer according to another embodiment.

FIGS. 5a through 6 illustrate another method of forming an embodiment of a MEMS device 1. Details regarding this embodiment that are similar to those for the previously described embodiment will not be repeated herein. In this embodiment, the wafer 500 and MEMS wafer 600 are bonded together and then bonded to the cap wafer 300. The recesses around the MEMS structure are formed in the substrate 502 and the dielectric layer 308.

FIGS. 5a through 5c illustrate the processing of a wafer 500 and a MEMS wafer 600 according to an embodiment. In FIG. 5a, a substrate 502 is at an intermediate stage of processing. The substrate 502 has a recess 504 formed on a top surface. The recess 504 may be formed by, for example, etching, milling, laser techniques, combinations of these, or the like.

FIG. 5b illustrates the bonding of the MEMS wafer 600 to the top surface of the substrate 502 and over the recess 504. The MEMS wafer 600 may comprise similar materials as the substrate 502, although substrate 502 and MEMS wafer 600 need not both be the same material. The MEMS wafer 600 and substrate 502 may be bonded by direct bonding, fusion bonding, thermocompression bonding, glue bonding, eutectic bonding, or the like. The bonding process may be improved or expedited by the application of heat or pressure. In another embodiment, the MEMS wafer 600 may comprise a deposited layer on a top surface of the substrate 502 and a sacrificial oxide (not shown) deposited in the recess 504. Because the process is described above, the details are not repeated herein. The MEMS wafer 600 may be doped either through an implantation process to introduce p-type or n-type impurities into the MEMS wafer 600, or else by in-situ doping as the material is grown.

FIG. 5c illustrates the patterning of the MEMS wafer 600 into movable elements 606 and static elements 604. The patterning process may be accomplished by depositing a commonly used mask material (not shown) such as photoresist or silicon oxide over the MEMS wafer 600. The mask material is then patterned and the MEMS wafer 600 is etched in accordance with the pattern. The resulting structure is a MEMS device 1 having movable elements 606 formed over recess 504 to allow for free movement in at least one axis. The movable elements 606 may be supported by hinges, springs, beams, or the like (not shown) which may extend from the static elements 604. In an alternative embodiment, the movable elements 606, static elements 604, and recess 504 may be formed by first forming recess 504 and filling the recess with a sacrificial oxide (not shown). In this embodiment, the MEMS wafer 600 may then be bonded to substrate 502 and patterned as discussed above. The sacrificial oxide (not shown) may then be released by a wet etch process, such as a DHF treatment or a VHF treatment, to form the movable elements 606 over the recess 504.

FIG. 6 illustrates a process for bonding the structure comprising wafer 500 and MEMS wafer 600 to the cap wafer 300. The cap wafer 300 may be formed by the same method and materials as shown in FIGS. 3a through 3c. The bonding structure 402 may be formed between the static elements 604 and the dielectric layer 308. In an embodiment, the bonding structure 402 may comprise a single material such as a polymer, an adhesive, a glass solder, or the like for an adhesive bonding process, a glass frit bonding process, or the like. In other embodiments, the bonding structure 402 may comprise two separate materials, one formed on cap wafer 300 and one formed on the MEMS wafer 600. In this embodiment, the materials for the bonding structure 402 may comprise conductive materials such as Al, AlCu, Cu, Ge, AlGe, or the like and may be bonded together in a eutectic bonding process, a thermocompression bonding process, glue bonding, or the like. As shown in FIG. 1c, the bonding structure 402 includes a support structure 404 to surround and provide structural support for the projection of the overlying TSV 312.

The backsides of cap wafer 300 and wafer 500 may be thinned after the bonding process. The thinning process may include grinding and CMP processes, etch back processes, or other acceptable processes. Cap wafer 300 may be thinned to reduce the amount of processing time for the subsequent TSV formation process. Further, wafer 500 and cap wafer 300 may be thinned to reduce the overall package size of the MEMS device 1. The formation of the TSVs 312 has been previously described and is not repeated herein.

Embodiments may achieve advantages. The MEMS device can support the TSV without encroaching on the MEMS structure area. In addition, the support structure for the TSVs only minimally increases the bonding area. Thus, the support structure does not negatively affecting the bonding strength.

An embodiment is a method for forming a microelectromechanical system (MEMS) device. The method comprises forming a MEMS structure over a first substrate, wherein the MEMS structures comprises a movable element; forming a bonding structure over the first substrate; and forming a support structure over the first substrate, wherein the support structure protrudes from the bonding structure. The method further comprises bonding the MEMS structure to a second substrate; and forming a through substrate via (TSV) on a backside of the second substrate, wherein the overlying TSV is aligned with the bonding structure and the support structure.

Another embodiment is a semiconductor device comprising a first substrate; a bonding structure over the first substrate, a support structure over the first substrate, wherein the support structure protrudes laterally from the bonding structure, and a second substrate over the bonding structure and the support structure.

Yet another embodiment is a MEMS device comprising a MEMS structure over a first substrate, wherein the MEMS structure comprises a movable element and an adjacent static element; a bonding structure over the static element, a second substrate over the MEMS structure, wherein the first substrate, the bonding structure, and the second substrate form a cavity around the MEMS structure, and a TSV extending through the backside of the second substrate, wherein the bonding structure is configured to support the overlying TSV.

Although the present embodiments and their advantages have been described in detail, it should be understood that various changes, substitutions, and alterations can be made herein without departing from the spirit and scope of the disclosure as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to

What is claimed is:

1. A method for forming a microelectromechanical system (MEMS) device comprising:
   forming a MEMS structure over a first substrate, wherein the MEMS structure comprises a movable element;
   forming a bonding structure over the first substrate;
   forming a support structure over the first substrate;
   bonding the MEMS structure to a second substrate; and
   forming a through substrate via (TSV) from a backside of the second substrate, wherein the overlying TSV is aligned with the bonding structure and the support structure, wherein, in a plane parallel to a major surface of the second substrate, the bonding structure has a linear perimeter and the support structure has non-linear perimeter protruding from the linear perimeter of the bonding structure, the non-linear perimeter of the support structure being spaced from an outer perimeter of a projection of the overlying TSV by a constant width.

2. The method of claim 1, wherein the bonding structure and the comprise a same material.

3. The method of claim 1, wherein the constant width is from about 1 μm to about 20 μm.

4. The method of claim 1, wherein the forming the bonding structure is at a same time and by a same process as the forming the support structure.

5. The method of claim 1, wherein the forming the support structure comprises:
   depositing a first material on the MEMS structure;
   patterning the first material;
   depositing a second material over the second substrate; and
   patterning the second material.

6. The method of claim 1, wherein the forming the support structure comprises depositing a first material on the MEMS structure and patterning the first material.

7. The method of claim 1, wherein the forming the MEMS structure further comprises:
   depositing a first dielectric layer on the first substrate;
   etching a recess in the first dielectric layer;
   fusion bonding a wafer on the first dielectric layer; and
   etching the wafer to form the movable element.

8. The method of claim 1, wherein the forming the MEMS structure further comprises:
   etching a recess in the first substrate;
   fusion bonding a wafer on the first substrate; and
   etching the wafer to form the movable element.

9. A semiconductor device comprising:
   a bonding structure over a first substrate;
   a support structure over the first substrate, wherein the support structure protrudes laterally from the bonding structure;
   a second substrate having a frontside and a backside, the second substrate comprising an interconnect structure on the frontside of the second substrate, the second substrate being bonded to the first substrate using the bonding structure and the support structure, the frontside of the second substrate being proximate the first substrate and the backside of the second substrate being distal the first substrate; and
   a TSV extending through the second substrate and partially into the interconnect structure, at least a portion of the interconnect structure separating the TSV from the bonding structure and the support structure.

10. The semiconductor device of claim 9, wherein the bonding structure and the support structure comprise a same material.

11. The semiconductor device of claim 9, wherein the overlying TSV is aligned with the bonding structure and the support structure.

12. The semiconductor device of claim 11, wherein the support structure surrounds a projection of the overlying TSV by a width from about 1 μm to about 20 μm.

13. The semiconductor device of claim 9 further comprising:
   a first dielectric layer on the first substrate;
   a first recess in the first dielectric layer; and
   a MEMS structure over the first dielectric layer and the first recess, wherein the MEMS structure comprises a movable element and an adjacent static element, and wherein the bonding structure and the support structure are on the static element.

14. The semiconductor device of claim 13 further comprising:
   a second dielectric layer between the interconnect structure and the MEMS structure;
   a second recess in the second dielectric layer; and
   a TSV extending through a backside of the second substrate, wherein the overlying TSV is aligned with the bonding structure and the support structure, and wherein the TSV is coupled to the interconnect structure.

15. The semiconductor device of claim 9, further comprising a plurality of TSVs on a backside of the second substrate, wherein the overlying TSVs are aligned with the bonding structure and the support structure.

16. The semiconductor device of claim 15, wherein the semiconductor device comprises four sides, and wherein each of the four sides comprises at least one of the plurality of TSVs.

17. A MEMS device comprising:
   a MEMS structure over a first substrate, wherein the MEMS structure comprises a movable element and an adjacent static element;
   a bonding structure over the static element;
   a second substrate over the MEMS structure, wherein the first substrate, the bonding structure, and the second substrate form a cavity around the MEMS structure; and
   a TSV extending through a backside of the second substrate, wherein the bonding structure is configured to support the overlying TSV, wherein the overlying TSV is circular in shape, and wherein at least a portion of an outer edge of the bonding structure surrounding a projection of the overlying TSV has a circular shape.

18. The MEMS device of claim 17, wherein the cavity comprises a first recess in the first substrate and a second recess in the second substrate.

19. The MEMS device of claim 17, wherein the first substrate comprises a first dielectric layer, the cavity comprising a first recess in the first dielectric layer and a second recess in the second substrate.

20. The MEMS device of claim 17, wherein the outer edge of the bonding structure surrounding the projection of the overlying TSV is spaced from an outer edge of the projection of the overlying TSV by a constant width.

* * * * *

UNITED STATES PATENT AND TRADEMARK OFFICE
CERTIFICATE OF CORRECTION

| | | |
|---|---|---|
| PATENT NO. | : 9,085,456 B2 | Page 1 of 1 |
| APPLICATION NO. | : 13/471229 | |
| DATED | : July 21, 2015 | |
| INVENTOR(S) | : Yi Heng Tsai | |

It is certified that error appears in the above-identified patent and that said Letters Patent is hereby corrected as shown below:

In the claims

In Col. 9, line 23, claim 2, delete "and the comprise" and insert --and the support structure comprise--.

Signed and Sealed this
First Day of December, 2015

Michelle K. Lee
*Director of the United States Patent and Trademark Office*